(12) United States Patent
Bushey

(10) Patent No.: US 8,723,711 B1
(45) Date of Patent: May 13, 2014

(54) STAIR-STEP VOLTAGE RAMP MODULE INCLUDING PROGRAMMABLE GAIN AMPLIFIER

(71) Applicant: Texas Instruments Incorporated, Dallas, TX (US)

(72) Inventor: Bruce B. Bushey, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/727,118

(22) Filed: Dec. 26, 2012

(51) Int. Cl.
| | |
|---|---|
| H03M 1/00 | (2006.01) |
| G02F 7/00 | (2006.01) |
| H03K 4/06 | (2006.01) |
| H03K 4/50 | (2006.01) |
| H03K 17/22 | (2006.01) |
| H03K 4/56 | (2006.01) |
| G05F 1/445 | (2006.01) |
| H02M 3/156 | (2006.01) |

(52) U.S. Cl.
CPC . *H03M 1/00* (2013.01); *G02F 7/00* (2013.01); *H03K 4/06* (2013.01); *H03K 4/50* (2013.01); *H03K 17/223* (2013.01); *H03K 4/56* (2013.01); *G05F 1/445* (2013.01); *H02M 3/156* (2013.01)
USPC .......................................... 341/139; 327/131

(58) Field of Classification Search
CPC ............. H03M 1/00; G02F 7/00; H03K 4/06; H03K 4/50; H03K 17/223; H03K 4/56; G06F 1/445; H02M 3/156
USPC .......... 341/139, 137; 327/131, 134, 140, 142, 327/137, 112; 323/242, 282, 222
See application file for complete search history.

(56) References Cited

U.S. PATENT DOCUMENTS

| | | | |
|---|---|---|---|
| 5,184,062 A | * | 2/1993 | Ladwig ........................... 324/74 |
| 2010/0253559 A1 | | 10/2010 | Dasnurkar |
| 2011/0137604 A1 | | 6/2011 | Dasnurkar |

* cited by examiner

*Primary Examiner* — Joseph Lauture
(74) *Attorney, Agent, or Firm* — Steven A. Shaw; Wade James Brady, III; Frederick J. Telecky, Jr.

(57) ABSTRACT

A stair-step voltage ramp module includes a stair-step voltage ramp generator circuit including at least one clocked first digital to analog converter (DAC) configured to receive digital data signals (codes) and a first clock signal and provide a first stair-step voltage ramp waveform. A programmable gain operational amplifier (op amp) has an input coupled to receive the first stair-step voltage ramp waveform. A second DAC being a current output, multiplying DAC is positioned to provide a gain setting resistance for the op amp. The second DAC and op amp configuration can be changed to provide gain or attenuation, or both. The output of the op amp provides a stair-step voltage ramp output suitable for applications including testing analog to digital converters (ADCs) having 10 or more bits.

18 Claims, 9 Drawing Sheets

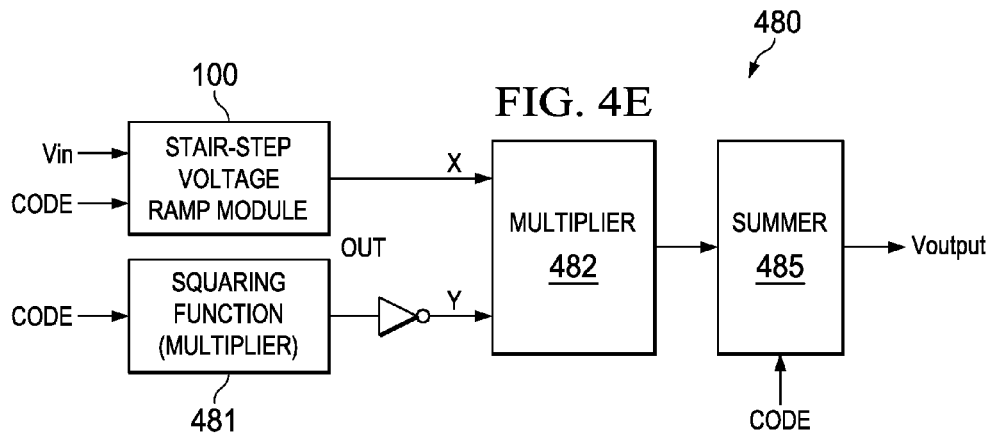
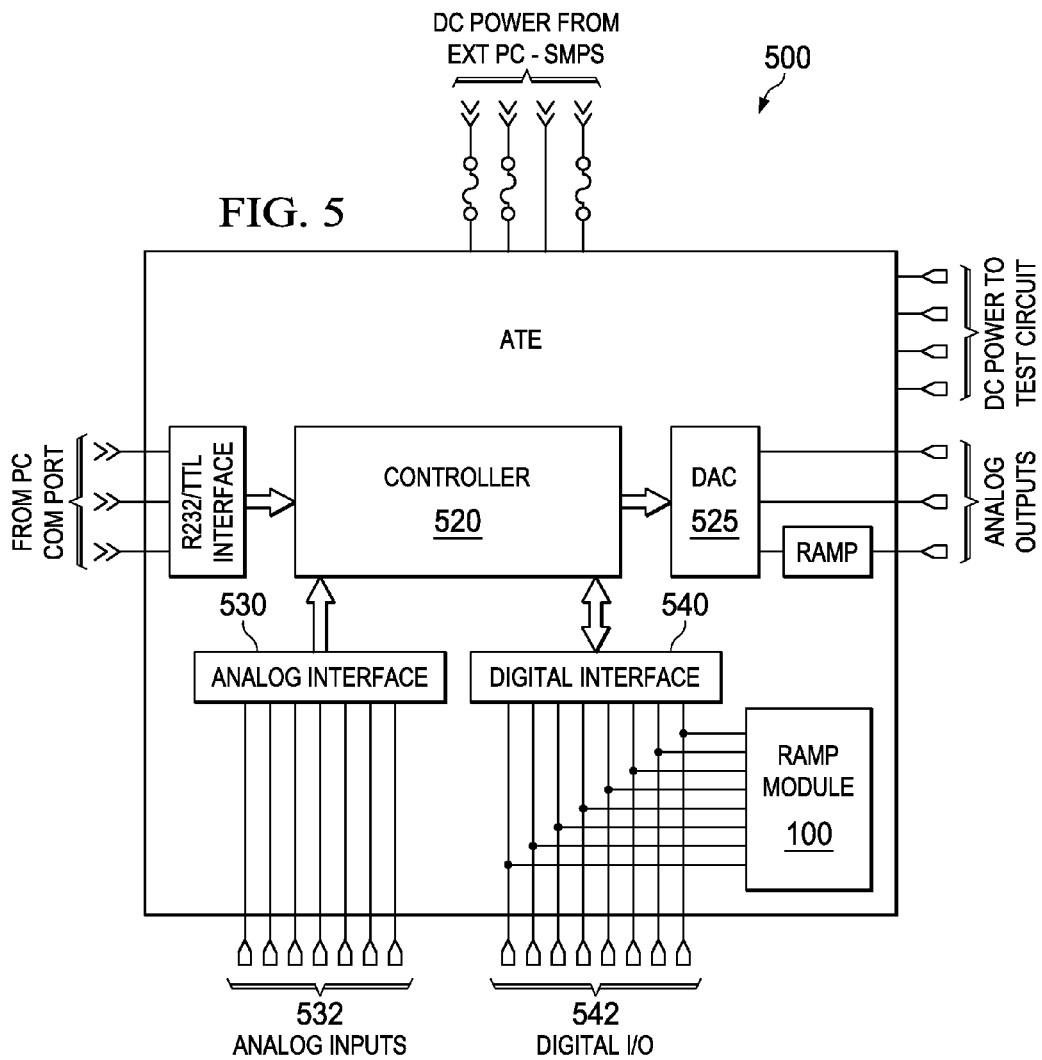

STAIR-STEP VOLTAGE RAMP MODULE INCLUDING PROGRAMMABLE GAIN AMPLIFIER

FIELD

Disclosed embodiments relate to stair-step voltage ramp generators.

BACKGROUND

Automated Test Equipment (ATE) refers to apparatus which performs tests on a semiconductor device, known as the Device Under Test (DUT). The DUT is physically connected to the ATE by a robotic machine called a handler or prober and through a customized Interface Test Adapter or a "fixture" that adapts the ATE's test resources to the DUT.

Several of the available ATE for testing integrated circuits (ICs) have the capability to test analog to digital converters (ADCs). For example, the Teradyne/Eagle ETS-364 (Teradyne, Inc., North Reading, Mass.) can test ADCs. The all codes Ramp/Histogram method is generally used for testing ADCs. For the all codes Ramp/Histogram method, the analog input stair-step voltage ramp to the ADC must be linear, accurate, and be provided as very small voltage steps. However, known ATE resources are not accurate enough (i.e. have sufficient linearity and resolution) to test more than 8 bit ADCs.

For example, a 12 bit ADC, with 30 divisions per one code (or hits per code) and a 5 V full scale voltage range, requires an input voltage resolution better than about $5V/(2^{12})/30=40.7$ µV. The accuracy of the ATE must be about at least 10 times better than this 40.7 µV resolution value (which equates to ≈4 µV resolution). However, the resolution of the ETS-364 Tester's various instruments is 80 µV, which is too coarse for 12 bit ADC testing. If the input voltage is not accurate enough, the tester will provide false results for the ADC. What is needed is a source of a linear, accurate and fine granularity stair-step voltage ramp for accurately testing devices including ADCs having 10 or more bits.

SUMMARY

Disclosed embodiments include stair-step voltage ramp modules having a stair-step voltage ramp generator circuit including a clocked first digital to analog converter (DAC) that provides a first stair-step voltage ramp waveform. A programmable gain operational amplifier (op amp) stage has an input coupled to receive the first stair-step voltage ramp waveform. The gain of the programmable gain op amp is set to compensate for shortened code length testing of certain analog to digital converters (ADCs) that is recognized herein to produce less than the target end voltage for the ADC being tested.

The stair-step voltage ramp module includes a second DAC, being a current output, multiplying DAC (which does not have an internal op amp) positioned to provide a gain setting equivalent impedance (referred to herein as an equivalent resistance or simply resistance) connected across the op-amp. A current output, multiplying DAC as gain setting resistance has been found to achieve a good resolution of op amp gain settings, such as 32,768 gain selections between an integer gain of 1 and 2 when using a 16 bit DAC.

For testing DACs, test engineers generally need the ability to vary the hits-per-digital input (code), such as from 20 to 26, to 32 or 40 or 50, or up to 64. This means the stair-step voltage generator needs the ability to stop before it gets to the last code. In the 16 bit case, depending upon the "hits-per-code" specified, the voltage ramp utilized may thus stop at a code lower than 65,536 ($2^{16}$). As noted above, shortened code length is recognized herein to produce less than the target end voltage. For example, if 65,536 codes produce +5.00 VDC which may be the full specified voltage range for the DAC, then a stair-step with a length of 32,768 will only produce +2.50 VDC. Disclosed software provided calculates the gain needed to maintain the full specified voltage range for the ADC being tested, which is implemented by programming the equivalent resistance of the current output, multiplying DAC to obtain the gain needed to maintain the target end voltage, such as a gain of 2 in the case of a stair-step with a code length 32,768 for the 16 bit case.

The use of a current output, multiplying DAC to provide a gain setting resistance for the op-amp is based on the unexpected discovery that a current output, multiplying DAC can be used as an input resistance or feedback resistance element for an op amp to realize a desired amplifier gain or attenuation. Disclosed software calculates the gain needed to maintain the full specified voltage range for the ADC being tested, and then the DAC resistance to obtain this gain, and given the relation between DAC resistance the particular code needed to obtain this resistance. The needed DAC input code is calculated to provide the gain of the programmable gain op amp, which can be implemented at test set up. As evidenced below (see FIG. 6), disclosed stair-step voltage ramp modules can be at least 17 bits linear, such as for accurately testing of 10 bit, 12 bit, or lower bit ADCs.

BRIEF DESCRIPTION OF THE DRAWINGS

Reference will now be made to the accompanying drawings, which are not necessarily drawn to scale, wherein:

FIG. 5 is a block diagram depiction of example ATE electronics including a disclosed stair-step voltage ramp module for testing semiconductor devices.

DETAILED DESCRIPTION

Figure 1A:
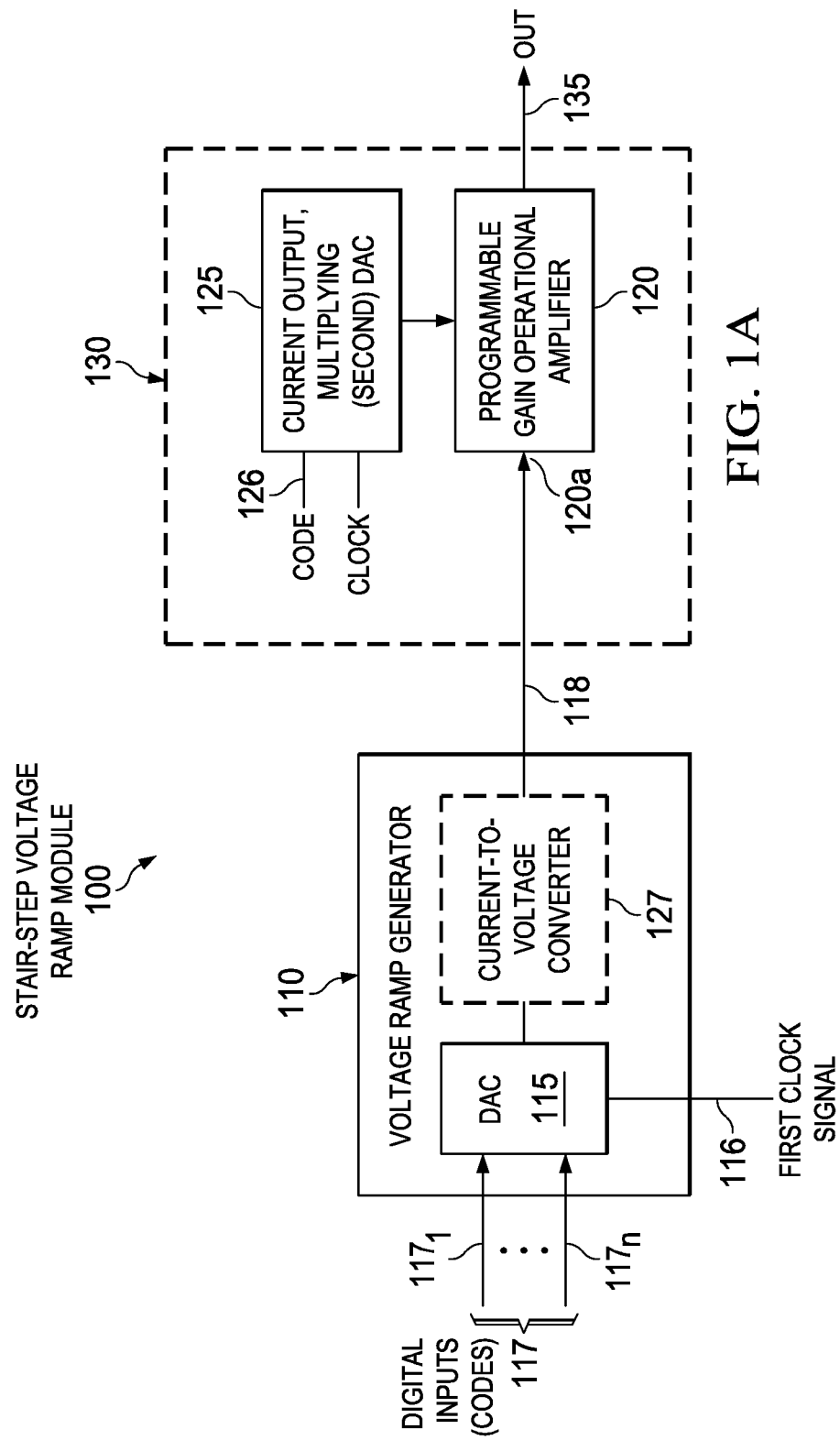
FIG. 1A is a block diagram of an example stair-step voltage ramp module including a stair-step voltage ramp generator circuit comprising at least one clocked DAC coupled to a programmable gain stage including an op amp having a second DAC being a current output, multiplying DAC as a programmable gain setting resistor, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1A is a block diagram of an example stair-step voltage ramp module 100 including a stair-step voltage ramp generator circuit 110 comprising at least one clocked first DAC 115 coupled to a programmable gain stage 130 including an op amp 120 having a second DAC 125 being a current output, multiplying DAC positioned as a programmable gain setting resistor, according to an example embodiment. Clocked first DAC 115 is configured to receive input signals including first digital data signals (codes) $117_1$ to $117n$ (n=16 for a 16 bit DAC; first data signals collectively referred to as codes 117) and a first clock signal 116. The clock signal 116 (or control signal) to the first DAC 115 is provided to match the rate the codes are received, such as at about 100 kHz. First DAC 115 provides at its output a stair-step voltage ramp waveform 118 when embodied as a voltage output DAC, or a stair-step current ramp waveform when embodied as a current output, multiplying DAC that can be converted into stair-step voltage ramp waveform 118 by coupling to the input (e.g., inverting input) of a current-to-voltage converter shown as 127 in FIG. 1A with a dashed box in FIG. 1A. The current-to-voltage converter 127 can comprise a transconductance op amp, such as the Texas Instruments OPA277.

In one particular embodiment, the first DAC 115 is the Texas Instruments' DAC8820, which is a 16-bit, parallel input current output, multiplying DAC, where the microcontroller-compatible inputs are codes 0 to 15 (D0 to D15), a write control digital input (WR), a reset, and Digital input load DAC control (LDAC) which functions as a clock which when high, data is loaded from its input register into its DAC register, updating the DAC output. An applied external reference input voltage ($V_{REF}$) determines the full-scale output current for the DAC8820.

A programmable gain stage for stair-step voltage ramp module 100 is provided by a programmable gain op amp 120 which has an input 120a coupled to receive the stair-step voltage ramp waveform 118. A second DAC 125 being a current output, multiplying DAC 125 is shown positioned as a gain setting resistance for the programmable gain op amp 120. As described above, disclosed software calculates the gain needed to maintain the full specified voltage range for the device (e.g., ADC) being tested, and then the resistance for second DAC 125 to obtain this gain, and given the relation between DAC resistance the particular code needed to obtain this resistance (See FIG. 4A and FIG. 4B described below) is obtained for programming the gain of the programmable gain op amp, which can be implemented solely at test set up.

The code 126 shown applied to the second DAC 125 controls the resistance of the variable resistance (Rvar in FIG. 1B) provided by the second DAC 125 and thus its equivalent resistance, which sets the gain of the op amp 120 to maintain the full specified voltage range for the device (e.g., ADC) being tested. As known in the art, the op amp general transfer function in the inverting configuration is: Vout=$-Vin*R_f/R_i$). This fixed gain needed for most test applications is usually between 1.0 and 4.5, and can be any number; not only integers. After applying the code to setting the resistance of the second DAC 125 to obtain the desired op amp gain, then no further set up via control signals is needed for the second DAC 125 during operation for testing a particular ADC.

Figure 1B:
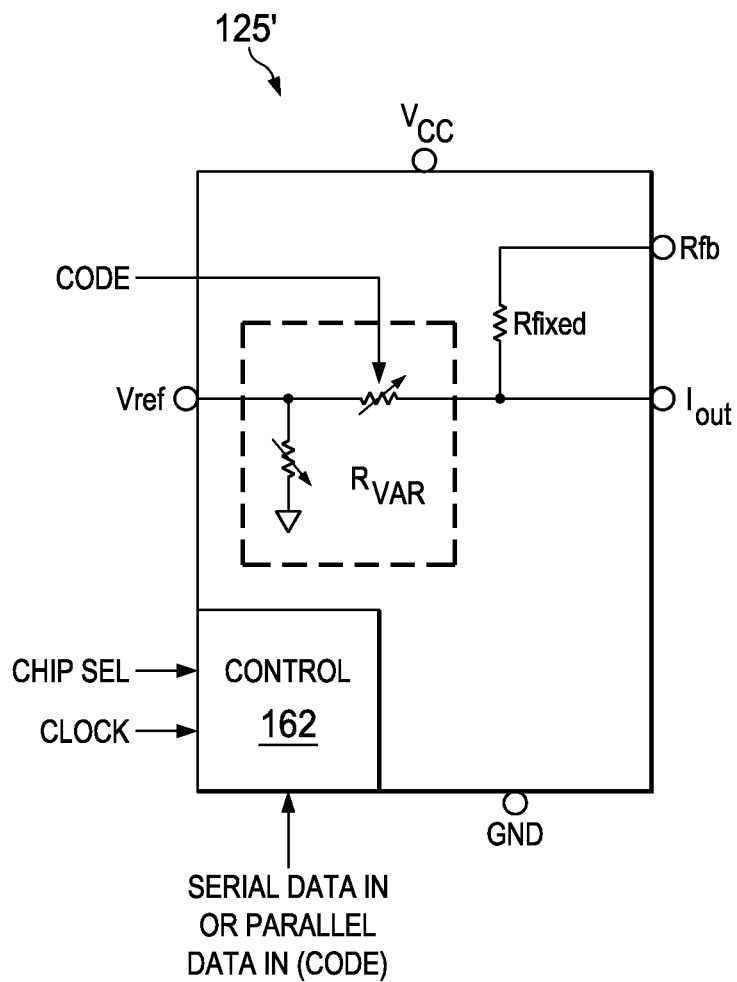
FIG. 1B is a simplified depiction of a known current output, multiplying DAC that may be used with disclosed embodiments.

FIG. 1B is a simplified depiction of the circuitry for a second DAC 125' being a current output, multiplying DAC that may be used with disclosed embodiments for the second DAC 125. Second DAC 125' includes a control section 162 for receiving inputs including a reference voltage (Vref), chip select, and clock, and serial or parallel digital data in (codes). Vref alternatively may be generated on-chip. The codes input to Second DAC 125' change the value of its variable resistor Rvar, which changes it equivalent resistance. Second DAC 125' usually also includes the fixed resistor (Rfixed) shown in FIG. 1B.

Figure 2:
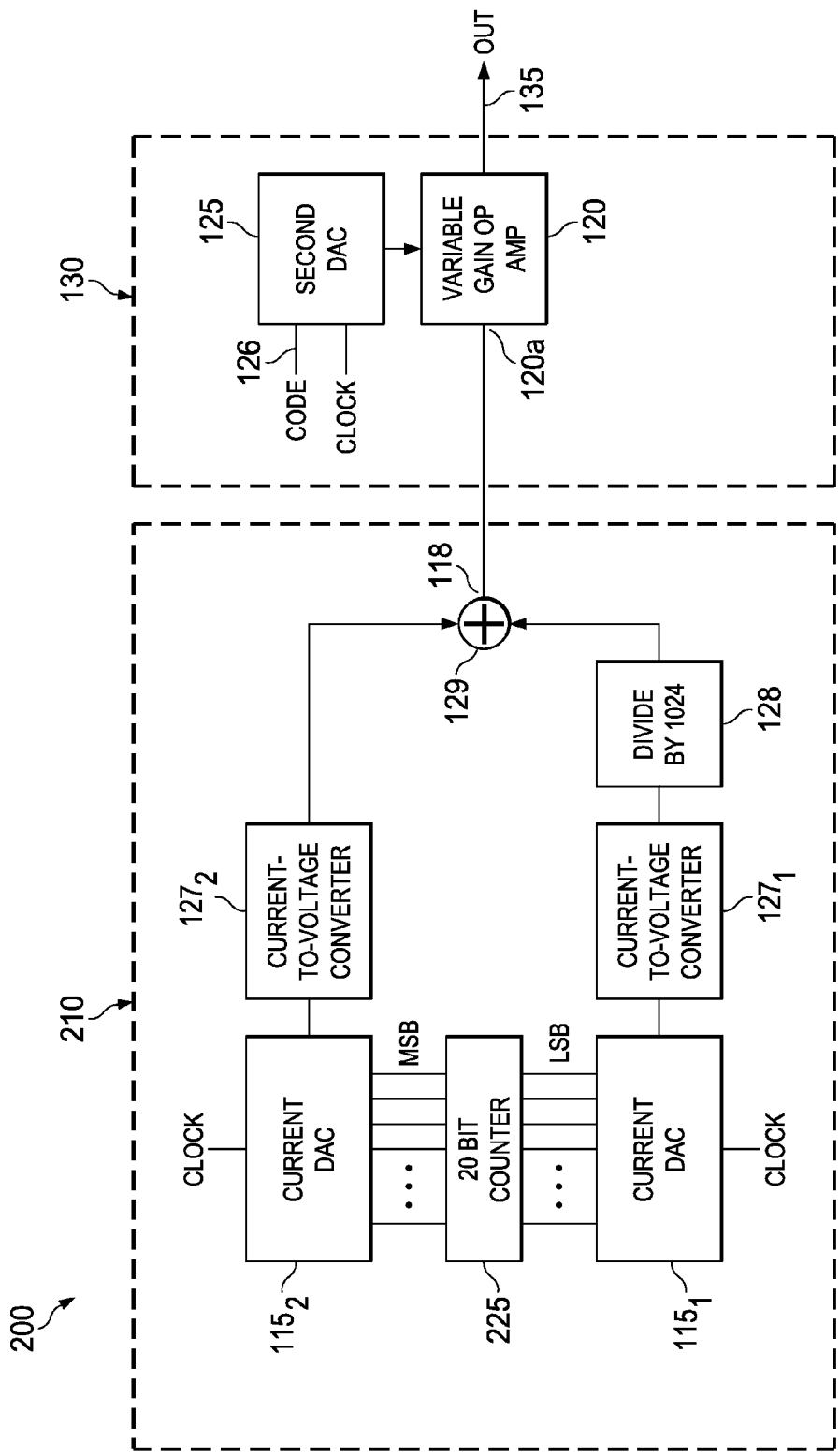
FIG. 2 is a block diagram of an example stair-step voltage ramp module including a stair-step voltage ramp generator circuit comprising a first clocked 10 bit DAC and second clocked 10 bit DAC coupled to a programmable gain stage including an op amp having a current output, multiplying DAC positioned as a programmable gain setting resistor, according to an example embodiment.

FIG. 2 is a block diagram of an example stair-step voltage ramp module 200 including a stair-step voltage ramp generator circuit 210 comprising a first clocked current DAC $115_1$ and a second clocked current DAC $115_2$ coupled to a programmable gain stage including an op amp 120 having a second DAC 125 being a current output, multiplying DAC as a programmable gain setting resistor, according to an example embodiment. An example 20 bit counter 225 provides the codes shown as the 10 least significant bits (LSBs) to first clocked DAC $115_1$ and most significant 10 bits (MSBs) to the second clocked DAC $115_2$. Alternatively, known test electronics can provide the codes. These 2 examples can be expanded to include other number of bits forming the small resolution stair-step ramp. Likewise, other current or multiplying DACs, with different number of bits, can be used as the variable resistor to obtain the desired gain or attenuation.

Outputs of first clocked current DAC $115_1$ and a second clocked current DAC $115_2$ are each coupled to respective current-to-voltage converters ($127_1$ and $127_2$). Current-to-voltage converter $127_1$ is coupled to a voltage divider 128 shown as a divide by 1024 ($2^{10}$) to reflect lower voltage levels consistent with the LSBs, as compared to the MSBs. A summer 129 receives the outputs from the current-to-voltage converters $127_1$ and $127_2$. The output of the summer 129 is coupled to an inverting input 120a of the op amp 120, which provides the variable gain stage. FIGS. 3A-D are depictions that show several example programmable gain stage configurations including an op amp 120 having a second DAC 125' being a current output, multiplying DAC as its gain setting resistor, which show examples of how to hook up a current output, multiplying DAC to implement a gain setting resistor for the op amp 120, according to example embodiments. In these FIGs, the Vin shown is the stair-step voltage ramp waveform 118 output by the stair-step voltage ramp generator circuit, such as the stair-step voltage ramp generator circuit 110 shown in FIG. 1A or the stair-step voltage ramp generator circuit 210 shown in FIG. 2. In FIGS. 3A-D, stair-step voltage ramp waveform 118 is coupled to the Vref pin or the Rfb pin of the second DAC 125', and the Iout pin connected to the inverting (−) input of the op-amp 120 which is at a virtual ground by the grounding of the non-inverting input (+) of the op amp 120.

Figure 3A:
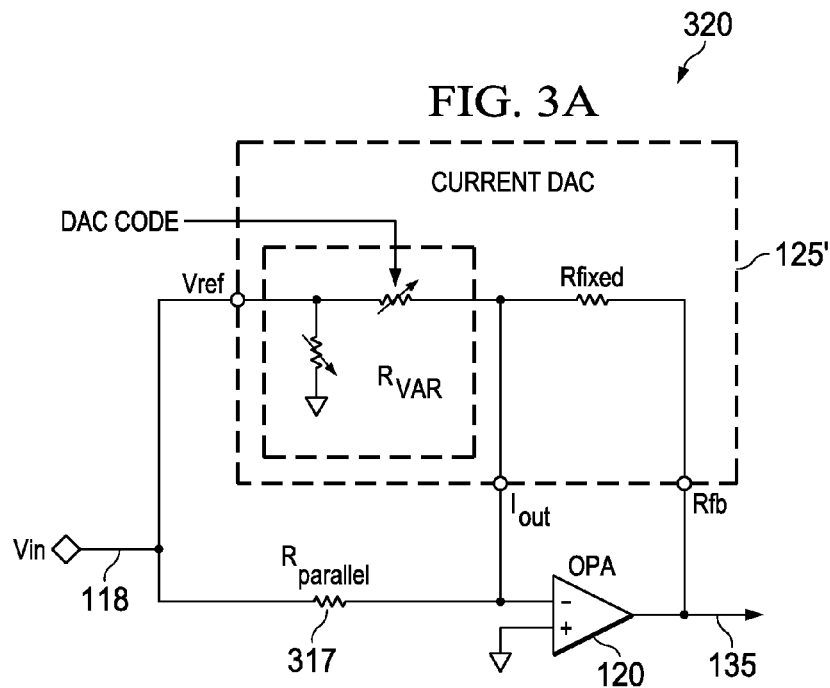
FIGS. 3A-D are depictions that show several example programmable gain stage configurations including an op amp having a current output, multiplying DAC as a programmable gain setting resistor, which show examples how to hook up the current output, multiplying DAC in the circuit for implementing a gain setting resistor, according to example embodiments.

Programmable attenuation stage configuration 320 shown in FIG. 3A features a resistor shown as $R_{parallel}$ 317 that is electrically in parallel to the variable DAC resistance (Rvar) provided by the second DAC 125', which are both input resistors for the op amp 120. Programmable attenuation stage configuration 320 is an attenuation stage because it only attenuates the input with a maximum gain of one. $R_{parallel}$ 317 changes the second DAC 125' resistance value vs. DAC code relation shown in FIG. 4A described below to obtain the substantially more linear resistance value vs DAC code relation shown in FIG. 4B.

Figure 3B:
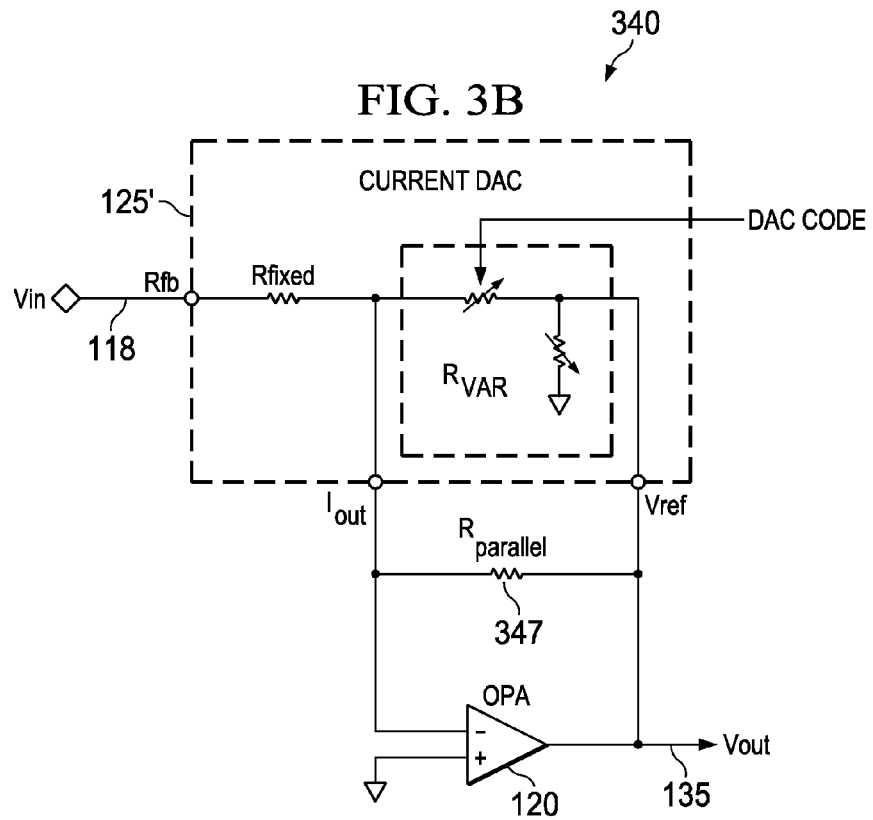

FIG. 3B shows a programmable gain stage configuration 340 which features a resistor shown as $R_{parallel}$ 347 that as a feedback resistor is a electrically in parallel to the variable DAC resistance (Rvar) provided by the second DAC 125' that is also a feedback resistors for the op amp 120. Programmable gain stage configuration 340 will not attenuate but rather gain up the signal with a minimum gain of one.

Figure 3C:
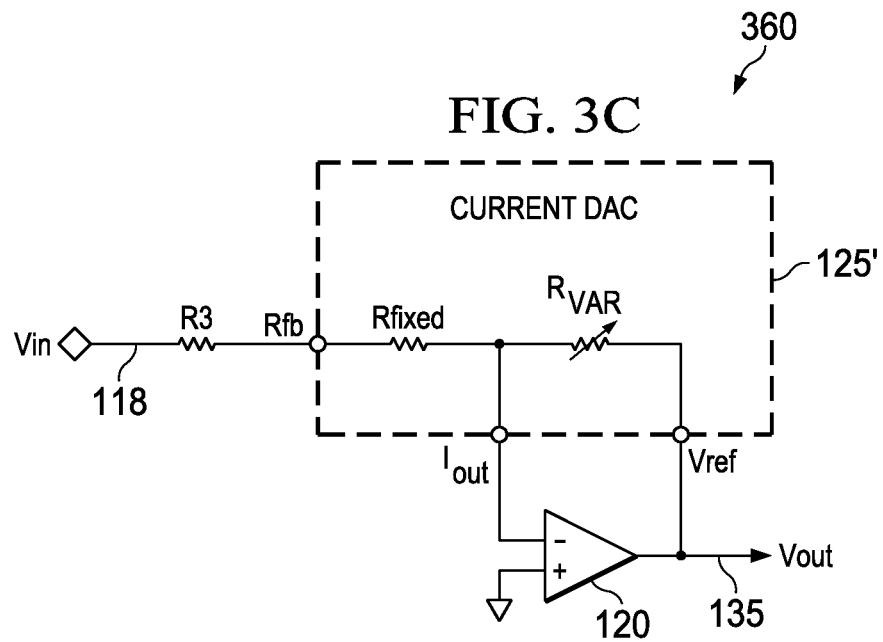
Figure 3D:
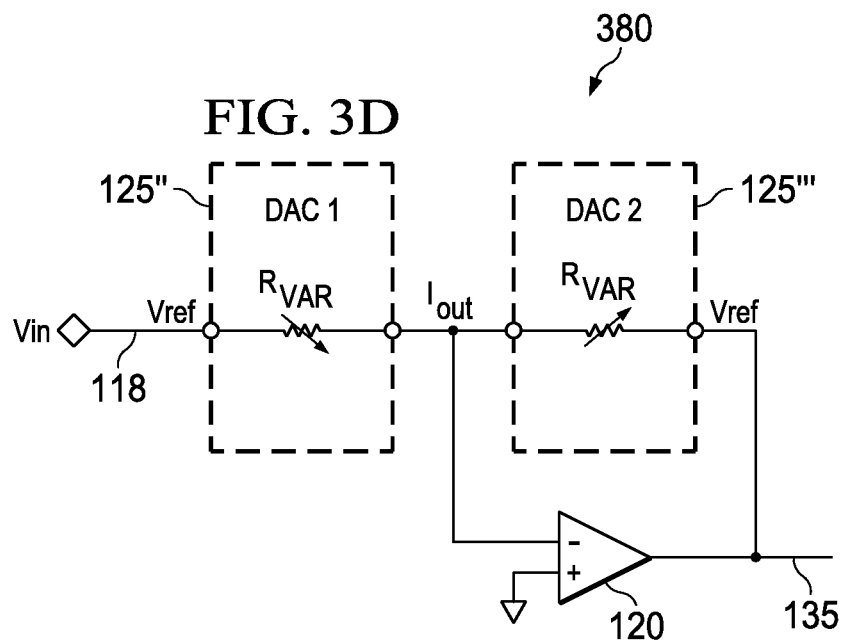

FIG. 3C shows a programmable gain stage configuration 360 that provides more limited signal attenuation and a larger range of gains. An additional input resister shown as R3 is provided in series with Rfixed. FIG. 3D shows another programmable gain stage configuration 380 that provides a more linear transfer function by having second DACs 125" and 125''' both being current output, multiplying DACs to provide both an input resistor and a feedback resistor for op amp 120. For programmable gain stage configuration 360 the fixed internal resistor $R_{fb}$ for the DACs can be left open (unused) or connected in series or in parallel. This arrangement provides a large variety of combinations of possible attenuation or gain.

Figure 4A:
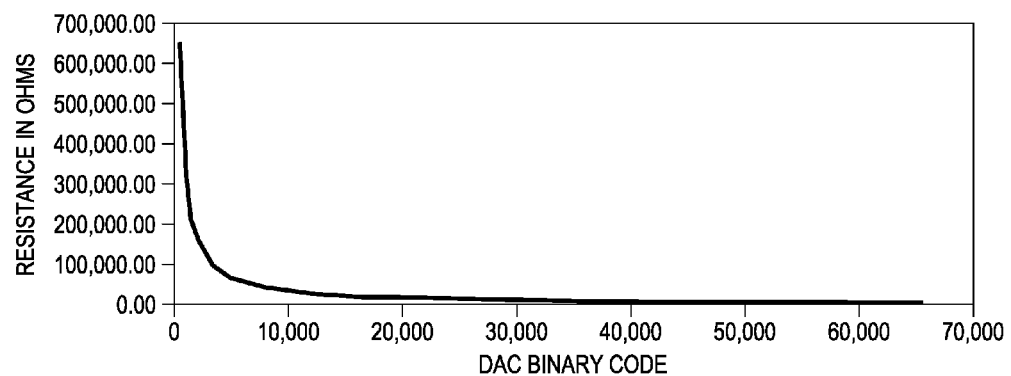
FIGS. 4A-4B show data that demonstrates that a current output, multiplying DAC can provide an equivalent resistance that is a function of the input code provided to it, according to example embodiments.
Figure 4B:
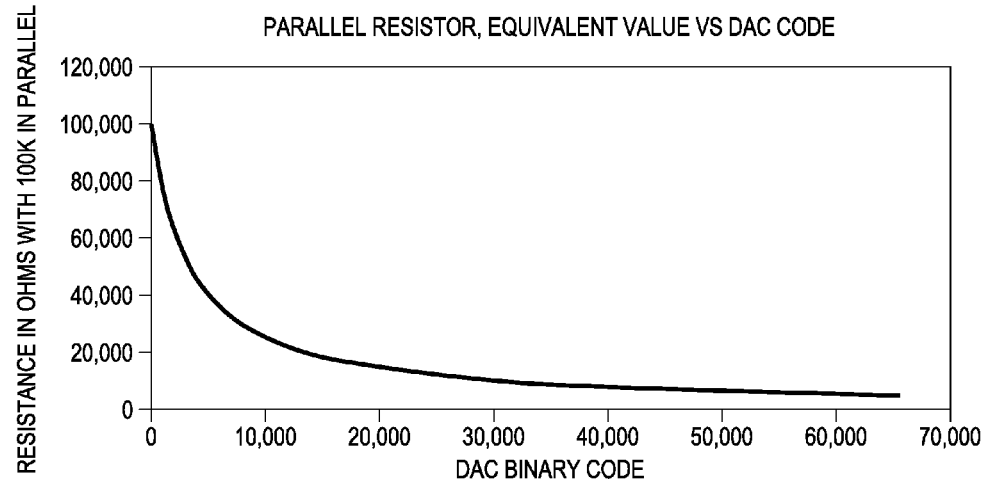

FIGS. 4A and 4B provide data that demonstrates that a current output, multiplying DAC can provide an equivalent resistance that is a function of the binary code provided to it. As described above, the programmable gain of the op-amp 120 is set by a code which sets the equivalent resistance of the current output, multiplying DAC to provide the op amp 120 a gain which compensates the output voltage range for a shortened ramp length.

FIG. 4A is a plot of equivalent resistance vs. code for a 16 bit (65,536) current output DAC. The equivalent DAC resistance was equal to Rfixed*65,536/DAC code, and Rfixed was equal to 5 k ohms. The curve in FIG. 4A at code zero is an open circuit (resistance is infinite, a condition which should be avoided). There are also 2 areas of the curve that are both asymptotic to the graph axes.

This equivalent resistance vs. code can be used to select a DAC resistance as the gain setting resistor element for the op amp 120. However, as described below, adding an extra resistor parallel to Rvar referred to herein as $R_{parallel}$ improves the linearity of the equivalent resistance vs. code relation.

FIG. 4B is a plot of equivalent resistance vs. code for a 16 bit (65,536) current output, multiplying DAC having an extra resistor $R_{parallel}$ parallel to Rvar which can be seen to linearize the programmable gain stage. Rtotal=(Rvar*R parallel)/(Rvar+Rparallel), where Rvar=Rdac fixed (5 k ohm)*65,536/DAC CODE. Rparallel was equal to 100 k ohms. FIG. 4B can be seen to provide a more gradual change in the resistance for each of the 65,536 codes as compared to the curve shown in FIG. 4A. The equivalent resistance vs. code curve shown in FIG. 4B also eliminates the possible infinite resistance problem at code zero shown in FIG. 4A by including Rparallel. Values other than 100 kohms can be used with similar effects.

The gain curve derived from the equivalent resistance vs. DAC code shown in FIGS. 4A and 4B have a 1/code (or 1/x) pattern. This relation even for the improved linearity case shown in FIG. 4B has significant non-linearity. To provide a further improvement in linearity an alternate embodiment is described below relative to FIGS. 4C and 4D.

The equation for the variable resistance in the 16 bit DAC for a fixed resistor of 5 kohms is: Rvar=65,536*5 k ohm/(Digital input code). In order to make this variable resistance curve more linear, consider the equation y=[−1*(Digital input code)]²/65,536, with a curve representing this equation shown in FIG. 4C. If these 2 curves (FIG. 4C and FIG. 4A) or equations are multiplied together by a suitable multiplier circuit and adding in a constant 65,537, then the resulting function is in the linear form as shown in FIG. 4D. The multiplying or squaring function can been implemented with analog multipliers such as the MPY634 IC from Texas Instruments. The equation for this more linear analog voltage function is: Vout=[{circuit in FIG. 1A=)*−(digital input code)²]+ 65,537.

Figure 4C:
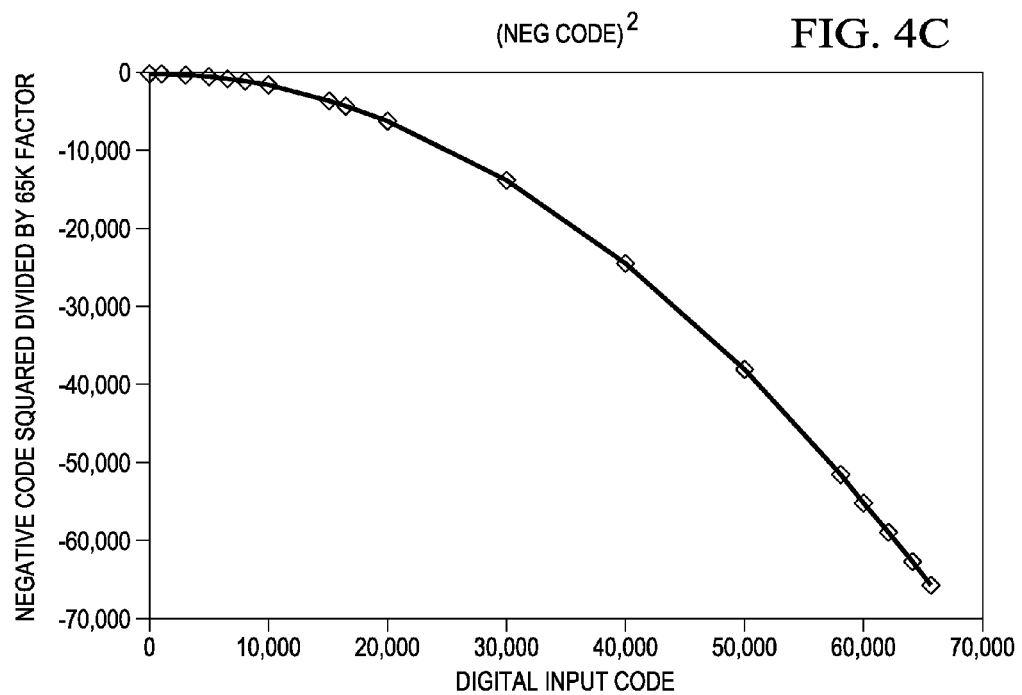
FIG. 4C is a plot of a curve that when multiplied by the 1/code equivalent resistance curve shown in FIG. 4A provides the linearized gain relation shown in FIG. 4D, according to another example embodiment.
Figure 4D:
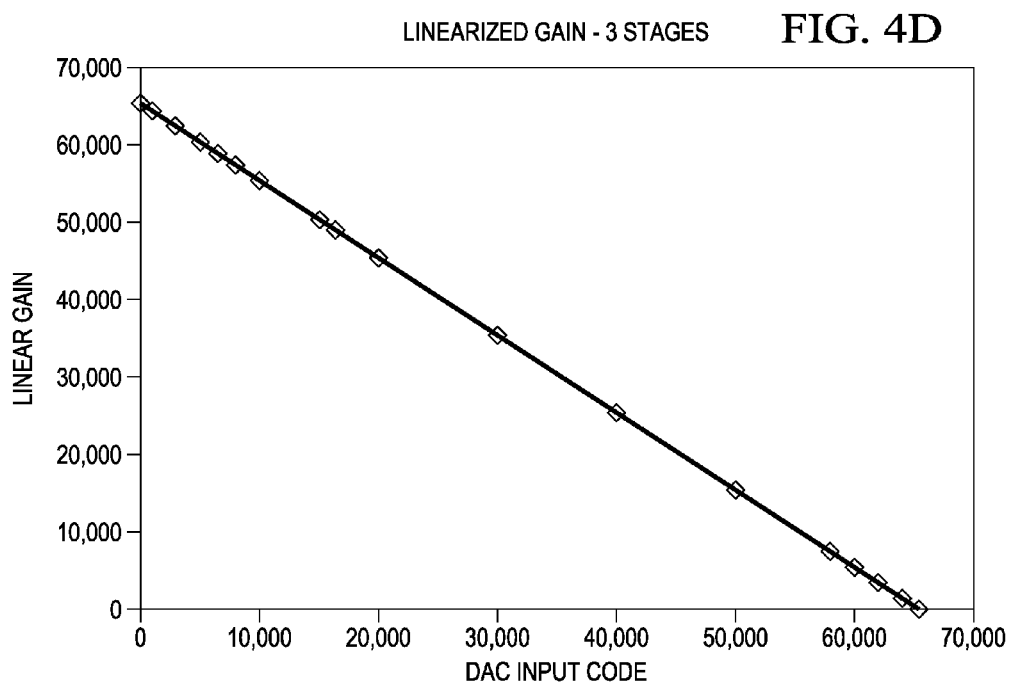
FIG. 4E is a block diagram of an example stair-step voltage ramp module having a more linear analog voltage function realized by implementing the resistance curve representing the equation shown in FIG. 4C, according to an example embodiment.

FIG. 4E is a block diagram of an example stair-step voltage ramp module 480 having a more linear analog voltage function realized by implementing the resistance curve representing the equation shown in FIG. 4C, according to an example embodiment. Stair-step voltage ramp module 480 includes the stair-step voltage ramp module 100 shown in FIG. 1A and a squaring function block 481 both coupled to a multiplier 482, where the output of the multiplier 482 is coupled along with a code input to a summer 485 which generates the stair-step voltage ramp shown as Vout.

FIG. 5 is a block diagram depiction of example ATE electronics 500 including a disclosed stair-step voltage ramp module 100 for testing a semiconductor device under test (DUT). The DUT is physically connected to the ATE electronics 500 by a handler or prober and through a customized Interface Test Adapter (ITA) or a fixture (not shown) that adapts the ATE electronics 500 to the DUT.

ATE electronics 500 includes a test controller 520. The controller is coupled to a tester DAC 525 which provides analog outputs. An analog interface 530 has pins for receiving analog inputs 532 from the semiconductor device and transmit the analog inputs 532 to inputs of the controller 520. ATE electronics 500 includes a digital interface 540 having digital I/O pins 542 coupled to receive digital inputs from the semiconductor device and to transmit the digital inputs to the controller, and transmit digital outputs from the controller 520 to the semiconductor device. A disclosed stair-step voltage ramp module 100 is switchably connected between the digital interface 540 and some of the digital I/O pins 542.

Generally for testing ADCs, often the voltage ramp applied to the ADC under test (ADUT) extends a few millivolts below the ADUT start voltage to a few millivolts above the ADUT specified Full Scale voltage range (e.g., ±10 mV). For example if the ADUT is specified to test from zero volts to +5.000 volts then the stair-step voltage ramp module 100 can start the stair-step voltage ramp at −0.010 Volts and extend the ramp to 5.010 volts. This insures that every code can be tested even with normal statistical tolerance variation in the ADUT and the ramp generation circuits. Accordingly, although not shown, an adjustable small negative voltage supply circuit can be provided with disclosed stair-step voltage ramp modules to have complete circuitry on one board.

A significant advantage of disclosed stair-step voltage ramp modules is the ability to provide a resolution to utilize voltage steps between the voltage steps for the device being tested. In the 16 bit DAC case, a 16 bit resolution stair-step ramp of 65,536 steps is available to test an ADC that has say 4096 steps or fewer. Improved voltage resolution allows finer measurement of the ADUT. For example if the (differential non linearity) DNL is one LSB, one can divide each of those LSB's into 16 substeps and get finer, better-quality measurement resolution. In this example, that is 16 hits per code or occurrences per LSB.

Other advantages of disclosed embodiment include being able to realize disclosed as a single circuit card module, which along with the associated software stored in a suitable memory implemented by a suitable processor is capable of generating a variety of stair step ramps to test a family of 8 bit, or 10 bit, or 12 bit, or higher bit ADCs. The software aids in the setup as it can read a file that contains the ADUT specification data and sets up the important ramp parameters as described above. Some of these parameters that the software can calculate and set up are the negative bias voltage that the ramp starts at and the final ramp voltage. As described above, since the count of the stair-step ramp specified may end before 65,536 ($2^{16}$) based upon the number of hits per code [the subdivisions per LSB], the software can calculate that and then set the equivalent resistance of the second DAC to correct the voltage gain so the ramp ends at the specified voltage. The software can be written in "C"; which has been found to ease use of disclosed modules.

Figure 6:
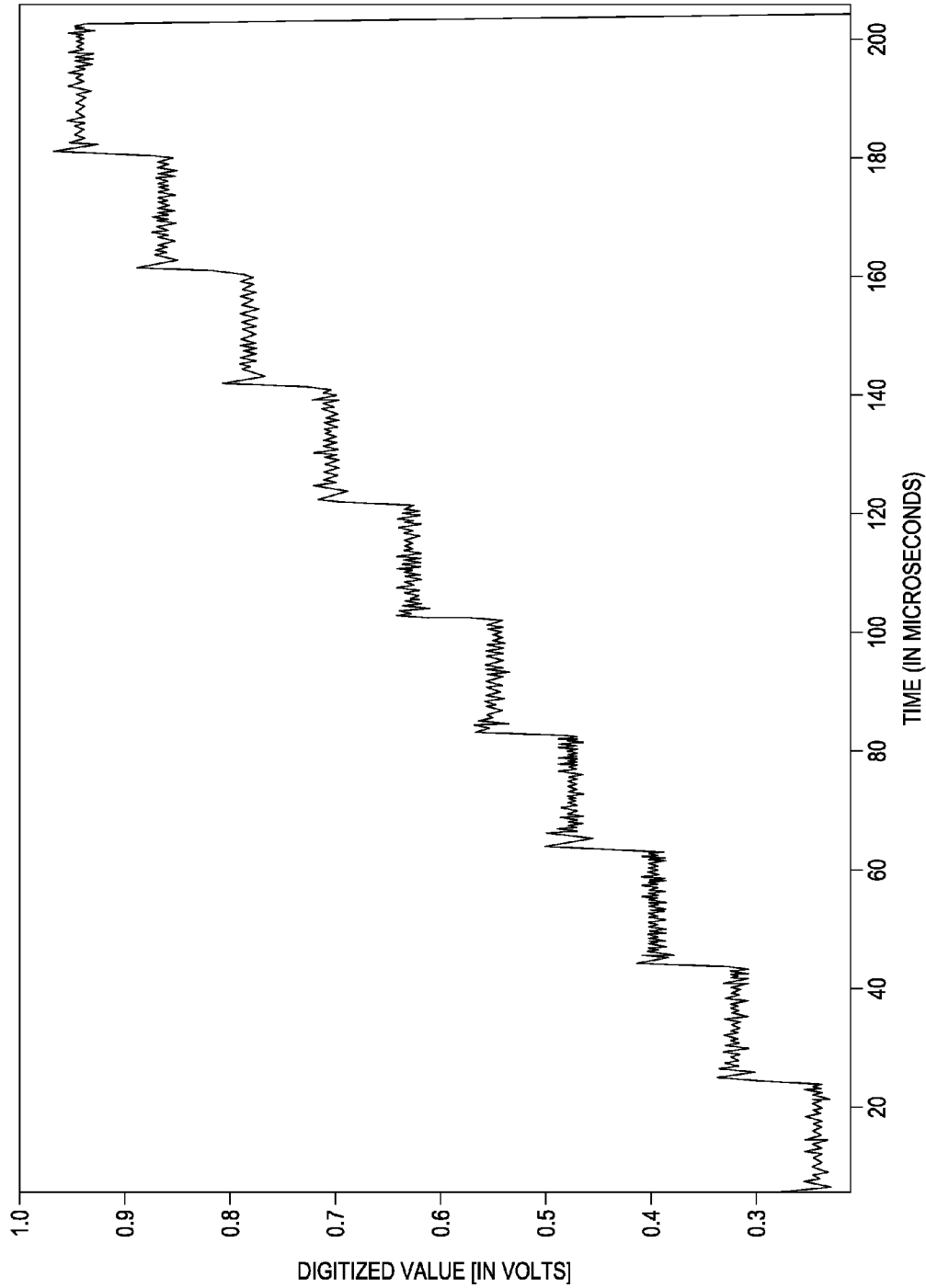
FIG. 6 is an example stair-step voltage ramp waveform portion implemented using the stair-step voltage ramp module shown in FIG. 1A between +0.24 V and +0.95 V, according to an example embodiment.

FIG. 6 is an example stair-step voltage ramp waveform portion obtained using the stair-step voltage ramp module 100 shown in FIG. 1A between +0.24 V to +0.95 V, according to an example embodiment. In this waveform portion the steps occur every 21 μsec; which can be changed by changing the frequency of the input codes. The data shown evidences 0.0000074% or a 7.4 PPM maximum error, which is better than 17 bit linearity.

The stair-step voltage ramp module has 3 modes: 1) setup, 2) calibration and 3) operation. As an example, the set up for testing using a disclosed stair-step voltage ramp module is described which details example set up and operation. After set up and calibration, then the counter (or other digital code source such as an ATE computer) can input digital codes and run the pairs of ramps many times (at the desired number of hits per code) to test many DUTs. This is historically in the art referred to as the ramp histogram method of ADC testing.

The set up software calculates the start and stop voltage on the ramp based upon DUT datasheet (PDS) parameters. Because there are offset voltage errors in the DUT (like DUT offset voltage around zero) and possible op-amp offset voltages, the ramp will be started a bit less than the DUT minimum voltage. The inputs from the test engineer for the software routine to set up the ramp are:
  Number bits in the DUT
  Desired Hits/code
  Max volts at Full Scale DUT analog input (example: 2V to 5V)
  Error in ramp amplitude; such as full-scale (FS) error, +DUT offset error, +(integral nonlinearity) INL The DUT errors that effect the ramp voltage extremes bring cause to have the ramp voltage start a bit below the DUT minimum [usually zero volts for unipolar] and go slightly above FS Maximum voltage. As an example, for one ADC under test (ADUT) to completely test good and marginally faulty ADCs, the ramp should start at −5 mV and end at 5.15 V, which defines the outside points each end of the ramp. This starting voltage may be called a bias voltage.

This operation above is done in a set up software function that runs once before operational use. After set up, the ramp can then be applied as many times as needed (e.g., maybe thousands of times).

The goal of testing a family of 8, 10 and 12 bit ADCs is generally to use an input stair-step voltage ramp and a histogram to measure DNL & INL. The input linear ramp is generated using a DAC with the data input being a count that increases to generate an increasing voltage ramp. That circuitry and a stable voltage reference are all on an example 17 bit Linearity Stair-step voltage Ramp Module. This Module is small being a few square inches and can fit on an ETS-364 HIB inside the parts area on the bottom, or it can be used with other ATEs.

The first DAC used (DAC 115 in FIG. 1A) can be a 16 bit DAC [very linear, such as the TI DAC8820] that therefore has 65,536 ($2^{16}$) output steps. If the DUT is 12 bits, then there are 16 hits for every code in the up ramp and 16 hits for the down ramp, as shown below: The DUT LSB size is shown for a 5V max Vin DUT.

| Ramp DAC Max Count | DUT bits | Max codes | Hits/ 1Ramp | Hits/ 2Ramp | DUT V/LSB | 5 V |
|---|---|---|---|---|---|---|
| 65,536 | 12 | 4096 | 16 | 32 | 1.221 | mV |
| 65,536 | 10 | 1024 | 64 | 128 | 4.883 | mV |
| 65,536 | 8 | 256 | 256 | 512 | 19.531 | mV |

The 12 bit ADC DUT is the hardest corner case, so this table shows the various hits/code and shows the ramp generation.

| 12 bit Hits per code | 2 ramps Hits/ ramp | Ramp DAC Max Count | Voltage At Max | μV/Step |
|---|---|---|---|---|
| 8 | 4.0 | 16,384 | 5 | 305.18 |
| 10 | 5.0 | 20,480 | 5 | 244.14 |
| 16 | 8.0 | 32,768 | 5 | 152.59 |
| 20 | 10.0 | 40,960 | 5 | 122.07 |
| 23 | 11.5 | 47,104 | 5 | 106.15 |
| 26 | 13.0 | 53,248 | 5 | 93.90 |
| 30 | 15.0 | 61,440 | 5 | 81.38 |
| 31 | 15.5 | 63,488 | 5 | 78.76 |
| 32 | 16.0 | 65,536 | 5 | 76.29 |

It can be seen from above that the smallest stair-step voltage ramp step size is less than the 1.22 millivolts that is the DUT LSB. In addition, the ATE source signal should be better than the DUT requirement; so each of the Stair-step voltage ramp steps precision should be 76 μV or less.

Another example of a corner case of the worse case DUT is the smallest voltage per step as shown below:

| Ramp DAC Max_Count | DUT bits | Codes | Hits/ 2Ramp | DUT FS V | μV/Step |
|---|---|---|---|---|---|
| 65,536 | 12 | 4096 | 32 | 4 | 61.04 |
| 65,536 | 12 | 4096 | 32 | 2 | 30.52 |
| 65,536 | 10 | 1024 | 128 | 2 | 30.52 |

As the number of hits per code decreases, then the volts per ramp step decreases correspondingly. So this table shows that this method of ramp generation can provide any number of hits per code by stopping the ramp count before 65,536. If the ramp count stops before 65,536, then as disclosed above the amplitude at that last step is increased by an op-amp to the required DUT FS maximum spec [here assumed to be 5 V].

Calibration is generally performed on the last (highest) positive voltage step. The voltage at that single point is measured by an accurate Voltmeter; and the gain is varied to achieve the desired end voltage (such as 5.015 VDC, for this example). After set up and calibration, then the counter (or an ATE computer, for example) can input digital codes and run the pairs of ramps many times (at the desired number of hits per code) to test many DUTs.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

I claim:

1. A stair-step voltage ramp module, comprising:
a stair-step voltage ramp generator circuit including at least one clocked first digital to analog converter (DAC) configured to receive digital data signals (codes) and a first clock signal and provide a first stair-step voltage ramp waveform;
a programmable gain operational amplifier (op amp) having an input coupled to receive said first stair-step voltage ramp waveform, and
a second DAC comprising a current output, multiplying DAC positioned to provide a gain setting resistance for said op amp,
wherein an output of said op amp provides a stair-step voltage ramp output.

2. The stair-step voltage ramp module of claim 1, wherein said clocked first DAC comprises a current output DAC, and said stair-step voltage ramp generator circuit further comprises to a current-to-voltage converter having an input coupled to an output of said second DAC.

3. The stair-step voltage ramp module of claim 1, wherein said clocked first DAC comprises a voltage output DAC.

4. The stair-step voltage ramp module of claim 1, further comprising a counter coupled to said clocked first DAC for providing said codes.

5. The stair-step voltage ramp module of claim 1, wherein said clocked first DAC includes parallel DAC paths including a clocked DAC associated with processing most significant bits (MSBs) of stair-step ramp voltage output and another clocked DAC associated with processing least significant bits (LSBs) of stair-step ramp voltage output.

6. The stair-step voltage ramp module of claim 1, wherein said second DAC is positioned as an input resistor for said op amp.

7. The stair-step voltage ramp module of claim 1, wherein said second DAC is positioned as a feedback resistor for said op amp.

8. The stair-step voltage ramp module of claim 1, further comprising a resistor coupled to an inverting input of said op amp in parallel to a variable resistor ($R_{Var}$) provided by said second DAC.

9. A method of generating a stair-step ramp voltage signal, comprising:
providing digital data signals (codes) representing discrete levels on a stair-case function, wherein an end ramp voltage level is defined by a last of said codes;
converting said codes using at least one clocked first digital to analog converter (DAC) to provide a first stair-step voltage ramp waveform ending at said end ramp voltage level,
calculating an end voltage compensating gain based on said end ramp voltage level and a target end voltage for said stair-step ramp voltage signal;
for an op amp having a second DAC being a current output, multiplying DAC as a gain setting resistance, calculating an equivalent resistance value for said second DAC to obtain said end voltage compensating gain;
given a relation between DAC equivalent resistance and codes for said second DAC, determining a compensating code value associated with said equivalent resistance value;
programming said second DAC with said compensating code value, and
coupling said digital data signals (codes) to said clocked first DAC, wherein an output of said op amp provides said stair-step ramp voltage signal which ramps to said target end voltage.

10. The method of claim 9, wherein said clocked first DAC comprises a current output, multiplying DAC coupled to a current-to-voltage converter to provide said first stair-step voltage ramp waveform.

11. The method of claim 9, wherein said clocked first DAC comprises a voltage output DAC.

12. The method of claim 9, wherein a counter provides said codes.

13. The method of claim 9, wherein said clocked first DAC includes parallel DAC paths including a DAC associated with processing most significant bits (MSBs) of stair-step ramp voltage signal and another DAC associated with processing least significant bits (LSBs) of stair-step ramp voltage signal.

14. The method of claim 9, further comprising providing a resistor coupled to an inverting input of said op amp in parallel to a variable resistor ($R_{Var}$) provided by said second DAC.

15. Automatic Test Equipment (ATE) electronics for testing a semiconductor device, comprising:
a test controller;
said controller coupled to a tester digital to analog converter (DAC) which provides analog outputs;
an analog interface having analog input pins coupled to receive analog inputs from said semiconductor device and transmit said analog inputs to inputs of said controller;
a digital interface having digital I/O pins coupled to receive digital inputs from said semiconductor device and to transmit said digital inputs to said controller, and to transmit digital outputs from the controller to said semiconductor device, and
a stair-step voltage ramp module switchably connected between said digital interface and said digital I/O pins, stair-step voltage ramp module comprising:
a stair-step voltage ramp generator circuit including at least one clocked first DAC configured to receive digital data signals (codes) and a first clock signal and provide a first stair-step voltage ramp waveform;
a programmable gain operational amplifier (op amp) having an input coupled to receive said first stair-step voltage ramp waveform, and
a second DAC comprising a current output, multiplying DAC positioned to provide a gain setting resistance for said op amp,
wherein an output of said op amp provides a stair-step voltage ramp output.

16. The ATE electronics of claim 15, wherein said clocked first DAC comprises a current output DAC, and said stair-step voltage ramp generator circuit further comprises to a current-to-voltage converter having an input coupled to an output of said current output DAC.

17. The ATE electronics of claim 15, wherein said clocked first DAC includes parallel DAC paths including a clocked DAC associated with processing most significant bits (MSBs) of stair-step ramp voltage output and another clocked DAC associated with processing least significant bits (LSBs) of stair-step ramp voltage output.

18. The ATE electronics of claim 15, further comprising a resistor coupled to an inverting input of said op amp in parallel to a variable resistor ($R_{Var}$) provided by said second DAC.

* * * * *